(12) United States Patent
Sharaf et al.

(10) Patent No.: US 9,076,593 B2
(45) Date of Patent: Jul. 7, 2015

(54) HEAT CONDUCTOR FOR USE WITH AN INVERTER IN AN ELECTRIC VEHICLE (EV) OR A HYBRID-ELECTRIC VEHICLE (HEV)

(75) Inventors: Nadir Sharaf, Bloomfield Township, MI (US); Slobodan Pavlovic, Novi, MI (US); Dilip Daftuar, West Bloomfield, MI (US); Ajmal Ansari, Canton, MI (US)

(73) Assignee: Lear Corporation, Southfield, MI (US)

( * ) Notice: Subject to any disclaimer, the term of this patent is extended or adjusted under 35 U.S.C. 154(b) by 745 days.

(21) Appl. No.: 13/339,762

(22) Filed: Dec. 29, 2011

(65) Prior Publication Data
US 2013/0170269 A1     Jul. 4, 2013

(51) Int. Cl.
*H01G 2/08* (2006.01)
*H05K 7/20* (2006.01)
*H02M 7/00* (2006.01)

(52) U.S. Cl.
CPC ............... *H01G 2/08* (2013.01); *H02M 7/003* (2013.01); *H05K 7/209* (2013.01); *Y02T 10/7022* (2013.01)

(58) Field of Classification Search
CPC ...... H01G 2/08; H05K 7/209; Y02T 10/7022; H02M 7/003
USPC ........................................ 361/329, 328, 323
See application file for complete search history.

(56) References Cited

U.S. PATENT DOCUMENTS

| | | |
|---|---|---|
| 3,604,082 A | 9/1971 | McBrayer et al. |
| 3,622,846 A | 11/1971 | Reimers |
| 3,656,035 A | 4/1972 | Corman et al. |
| 4,628,407 A | 12/1986 | August et al. |
| 4,670,814 A * | 6/1987 | Matsui et al. .............. 361/274.3 |
| 4,872,102 A | 10/1989 | Getter |
| 5,091,823 A | 2/1992 | Kanbara et al. |
| 5,239,443 A | 8/1993 | Fahey et al. |
| 5,367,437 A * | 11/1994 | Anderson ..................... 361/807 |
| 5,408,209 A | 4/1995 | Tanzer et al. |
| 5,469,124 A | 11/1995 | O'Donnell et al. |
| 5,498,030 A | 3/1996 | Hill et al. |
| 5,504,655 A | 4/1996 | Underwood et al. |
| 5,634,262 A | 6/1997 | O'Donnell et al. |
| 5,740,015 A | 4/1998 | Donegan et al. |
| 5,749,597 A | 5/1998 | Saderholm |

(Continued)

FOREIGN PATENT DOCUMENTS

| | | |
|---|---|---|
| CN | 2742712 | 11/2005 |
| CN | 101606210 | 12/2009 |

(Continued)

*Primary Examiner* — David M Sinclair
(74) *Attorney, Agent, or Firm* — Brooks Kushman P.C.

(57) ABSTRACT

A heat conductor for use with an inverter in an electric or hybrid-electric vehicle, the inverter including a direct current link capacitor having multiple film capacitors configured in a stack to form a substantially polygonal prism. Each film capacitor has orthotropic characteristics. The heat conductor has a first substantially planar member configured to contact a first side of the polygonal prism formed by one of the film capacitors, and a second substantially planar member configured to contact a second side of the polygonal prism opposite the first side of the rectangular prism, the second side of the rectangular prism formed by another one of the film capacitors. The first and second planar member are thermally conductive for dissipating heat generated by the film capacitors, are attached by an interconnect, and have sufficient rigidity to confine expansion of the film capacitors across the thicknesses thereof.

13 Claims, 3 Drawing Sheets

(56) References Cited

U.S. PATENT DOCUMENTS

| | | |
|---|---|---|
| 5,940,263 A | 8/1999 | Jakoubovitch |
| 5,959,191 A | 9/1999 | Lewis et al. |
| 5,973,923 A | 10/1999 | Jitaru |
| 6,031,751 A | 2/2000 | Janko |
| 6,045,151 A | 4/2000 | Wu |
| 6,087,916 A | 7/2000 | Kutkut et al. |
| 6,144,276 A | 11/2000 | Booth |
| 6,201,701 B1 | 3/2001 | Linden et al. |
| 6,206,466 B1 | 3/2001 | Komatsu |
| 6,222,733 B1 | 4/2001 | Gammenthaler |
| 6,262,891 B1 | 7/2001 | Wickelmaier et al. |
| 6,313,991 B1 | 11/2001 | Nagashima et al. |
| 6,326,761 B1 | 12/2001 | Tareilus |
| 6,386,577 B1 | 5/2002 | Kan et al. |
| 6,450,528 B1 | 9/2002 | Suezawa et al. |
| 6,466,441 B1 | 10/2002 | Suzuki |
| 6,529,394 B1 | 3/2003 | Joseph et al. |
| 6,819,561 B2 | 11/2004 | Hartzell et al. |
| 6,839,240 B2 | 1/2005 | Skofljanec et al. |
| 6,844,802 B2 | 1/2005 | Drummond et al. |
| 6,943,293 B1 | 9/2005 | Jeter et al. |
| 7,050,305 B2 | 5/2006 | Thorum |
| 7,109,681 B2 | 9/2006 | Baker et al. |
| 7,130,197 B2 | 10/2006 | Chin |
| 7,164,584 B2 | 1/2007 | Walz |
| 7,173,823 B1 | 2/2007 | Rinehart et al. |
| 7,204,299 B2 | 4/2007 | Bhatti et al. |
| 7,212,407 B2 | 5/2007 | Beihoff et al. |
| 7,236,368 B2 | 6/2007 | Maxwell et al. |
| 7,264,045 B2 | 9/2007 | Mehendale et al. |
| 7,289,329 B2 | 10/2007 | Chen et al. |
| 7,295,448 B2 | 11/2007 | Zhu |
| 7,375,287 B2 | 5/2008 | Rathmann |
| 7,375,974 B2 | 5/2008 | Kirigaya |
| 7,471,534 B2 | 12/2008 | Andersson et al. |
| 7,479,020 B2 | 1/2009 | Whitton |
| 7,554,817 B2 | 6/2009 | Nakakita et al. |
| 7,579,805 B2 | 8/2009 | Saito et al. |
| 7,646,606 B2 | 1/2010 | Rytka et al. |
| 7,660,099 B2 | 2/2010 | Imamura et al. |
| 7,710,723 B2 | 5/2010 | Korich et al. |
| 7,726,440 B2 | 6/2010 | Aisenbrey |
| 7,788,801 B2 | 9/2010 | Oggioni et al. |
| 7,791,887 B2 | 9/2010 | Ganev et al. |
| 7,798,833 B2 * | 9/2010 | Holbrook .................. 439/212 |
| 7,800,257 B2 | 9/2010 | Lu |
| 7,804,688 B2 | 9/2010 | Wakabayashi et al. |
| 7,864,506 B2 | 1/2011 | Pal et al. |
| 7,869,714 B2 | 1/2011 | Patel et al. |
| 7,907,385 B2 * | 3/2011 | Korich et al. ............. 361/306.1 |
| 7,920,039 B2 | 4/2011 | Shabany et al. |
| 7,952,225 B2 | 5/2011 | Reichard et al. |
| 7,952,876 B2 * | 5/2011 | Azuma et al. ................ 361/699 |
| 7,957,166 B2 | 6/2011 | Schnetzka et al. |
| 7,974,101 B2 | 7/2011 | Azuma et al. |
| 8,040,005 B2 | 10/2011 | Bhatti |
| 8,064,198 B2 | 11/2011 | Higashidani et al. |
| 8,064,234 B2 | 11/2011 | Tokuyama et al. |
| 8,072,758 B2 | 12/2011 | Groppo et al. |
| 8,098,479 B1 * | 1/2012 | Parler et al. .................. 361/309 |
| 8,110,415 B2 | 2/2012 | Knickerbocker et al. |
| 8,169,780 B2 | 5/2012 | Yoshino et al. |
| 8,376,069 B2 | 2/2013 | Nakatsu et al. |
| 8,416,574 B2 | 4/2013 | Tokuyama et al. |
| 8,422,230 B2 * | 4/2013 | Aiba et al. .................... 361/704 |
| 8,582,291 B2 | 11/2013 | Nakasaka et al. |
| 8,582,294 B2 * | 11/2013 | Guerin et al. ................. 361/688 |
| 8,654,527 B2 | 2/2014 | Wei et al. |
| 8,665,596 B2 | 3/2014 | Brereton |
| 8,675,364 B2 | 3/2014 | Tokuyama et al. |
| 2002/0106414 A1 | 8/2002 | Gernert |
| 2002/0130495 A1 | 9/2002 | Lotspih et al. |
| 2003/0053298 A1 | 3/2003 | Yamada et al. |
| 2005/0263273 A1 | 12/2005 | Crumly |
| 2007/0240867 A1 | 10/2007 | Amano et al. |
| 2007/0246191 A1 | 10/2007 | Behrens et al. |
| 2008/0117602 A1 * | 5/2008 | Korich et al. ................ 361/715 |
| 2010/0078807 A1 | 4/2010 | Schulz |
| 2010/0081191 A1 | 4/2010 | Woods |
| 2010/0157640 A1 | 6/2010 | Azuma et al. |
| 2010/0254093 A1 | 10/2010 | Oota et al. |
| 2010/0328883 A1 | 12/2010 | Ledezma et al. |
| 2010/0328893 A1 | 12/2010 | Higashidani et al. |
| 2011/0116235 A1 | 5/2011 | Ryu et al. |
| 2011/0214629 A1 | 9/2011 | Benoit |
| 2011/0235276 A1 | 9/2011 | Hentschel et al. |
| 2011/0267778 A1 | 11/2011 | Eckstein et al. |
| 2012/0031598 A1 | 2/2012 | Han et al. |
| 2012/0206950 A1 * | 8/2012 | Duppong et al. ............. 363/141 |
| 2013/0039009 A1 | 2/2013 | Shin et al. |
| 2013/0044434 A1 | 2/2013 | Sharaf et al. |
| 2013/0170269 A1 | 7/2013 | Sharaf et al. |
| 2013/0215573 A1 | 8/2013 | Wagner et al. |
| 2013/0223009 A1 | 8/2013 | Nakatsu et al. |
| 2013/0258596 A1 | 10/2013 | Sharaf et al. |
| 2014/0069615 A1 | 3/2014 | Kusaka |

FOREIGN PATENT DOCUMENTS

| | | |
|---|---|---|
| CN | 101981638 | 2/2011 |
| CN | 102013319 | 4/2011 |
| DE | 102007054618 A1 | 6/2008 |
| DE | 102008033473 A1 | 5/2009 |
| EP | 1028439 | 8/2000 |
| EP | 1484774 | 12/2004 |
| FR | 2903057 | 1/2008 |
| JP | 4256397 | 9/1992 |
| JP | 07297043 | 11/1995 |
| JP | 2004254358 A | 9/2004 |
| JP | 2007273774 | 10/2007 |
| JP | 2008078350 | 4/2008 |
| JP | 2008085168 A * | 4/2008 |
| JP | 2011182500 | 9/2011 |
| WO | 2010/144399 | 12/2010 |
| WO | 2011/138156 | 11/2011 |

* cited by examiner

HEAT CONDUCTOR FOR USE WITH AN INVERTER IN AN ELECTRIC VEHICLE (EV) OR A HYBRID-ELECTRIC VEHICLE (HEV)

TECHNICAL FIELD

The following relates to a heat conductor for use with an inverter in an electric vehicle (EV) or a hybrid-electric vehicle (HEV).

BACKGROUND

Automotive vehicles powered by an electric motor or an electric motor and a gasoline engine are commonly referred to as electric vehicles (EV) or hybrid-electric vehicles (HEV). As is well known in the art, such vehicles include batteries for supplying power to the electric motors thereof. Electric and hybrid-electric vehicles typically provide for charging such batteries using an interface configured to rectify electrical power from a 120 volt or 240 volt alternating current (AC) utility power line for storage by the vehicle batteries.

Electric and hybrid-electric vehicles also include an inverter for use in converting the direct current (DC) voltage provided by the vehicle batteries to an AC voltage for use in powering the electric motor or motors of the vehicle. Such an inverter may comprise switching modules, such as integrated gate bipolar transistor (IGBT) modules, and a DC link capacitor, which itself may comprise a plurality of film capacitors.

In converting an input DC voltage to an AC voltage output, the film capacitors of the DC link capacitor generate heat as a result of the switching operations of the IGBT power modules. The heat generated as a result of such operations should be dissipated so that the inverter may continue to operate efficiently. Such heat generated by the operation of the IGBT power modules and the DC link capacitor may be dissipated using a coldplate provided as part of the inverter.

In that regard, an exemplary power converter for use in electric or hybrid-electric vehicles is shown in U.S. Pat. No. 7,974,101 entitled "Power Converter." Exemplary heat dissipating devices, as well as various features thereof, are shown in U.S. Pat. No. 6,466,441 entitled "Cooling Device Of Electronic Part Having High And Low Heat Generating Elements," in U.S. Patent Application Publication No. 2010/0081191 entitled "Anisotropic Heat Spreader For Use With A Thermoelectric Device," and in U.S. Patent Application Publication No. 2010/0078807 entitled "Power Semiconductor Module Assembly With Heat Dissipating Element."

However, due to the heat generated as a result of the operation of an inverter used in an EV or HEV, there exists a need for additional heat dissipation beyond that which may be provided by standard coldplates currently in use with an EV or HEV inverter. Such an inverter would include a heat conductor configured to contact the DC link capacitor in order to provide for additional dissipation of the heat generated by inverter operation.

SUMMARY

According to one embodiment disclosed herein, a heat conductor is provided for use with an inverter in an electric vehicle (EV) or a hybrid-electric vehicle (HEV). The inverter includes a direct current (DC) link capacitor comprising a plurality of film capacitors configured in a stack to form a substantially polygonal prism. Each film capacitor has orthotropic characteristics such that a thermal conductivity across a thickness of each film capacitor differs from a thermal conductivity across another dimension of the film capacitor, and such that a stiffness across the thickness of each film capacitor is less than a stiffness across another dimension of the film capacitors.

The heat conductor comprises a first substantially planar member configured to contact a first side of the polygonal prism formed by a single one of the film capacitors. The first substantially planar member comprises a thermally conductive material for dissipating heat generated by the plurality of film capacitors. The heat conductor also comprises a second substantially planar member configured to contact a second side of the polygonal prism opposite the first side of the rectangular prism, the second side of the rectangular prism formed by another single one of the film capacitors. The second substantially planar member comprises a thermally conductive material for dissipating heat generated by the plurality of film capacitors. The heat conductor further comprises an interconnect for fixedly attaching the first and second substantially planar members. The first and second substantially planar members have sufficient rigidity to confine expansion of the plurality of film capacitors across the thicknesses thereof.

According to another embodiment disclosed herein, a heat conductor for use with an inverter in an electric vehicle (EV) or a hybrid-electric vehicle (HEV) is provided. The inverter includes a direct current (DC) link capacitor comprising a plurality of film capacitors configured in a stack to form a substantially polygonal prism. Each film capacitor has orthotropic characteristics such that a thermal conductivity across the thickness of each film capacitor differs from a thermal conductivity across another dimension of the film capacitor, and such that a stiffness across the thickness of each film capacitor is less than a stiffness across another dimension of the film capacitor.

In this embodiment, the heat conductor comprises a first plate configured to contact a first side of the polygonal prism formed by a single one of the film capacitors. The first plate is substantially coextensive with the first side of the prism and comprises a thermally conductive material for dissipating heat generated by the plurality of film capacitors. The heat conductor also comprises a second plate configured to contact a second side of the polygonal prism opposite the first side of the polygonal prism, the second side of the prism formed by another single one of the film capacitors. The second plate is substantially coextensive with the second side of the prism and comprises a thermally conductive material for dissipating heat generated by the plurality of film capacitors. The first and second plates have sufficient rigidity to confine expansion of the plurality of film capacitors across the thicknesses thereof.

According to a further embodiment disclosed herein, an inverter in an electric vehicle (EV) or a hybrid-electric vehicle (HEV) comprises a direct current (DC) link capacitor comprising a plurality of film capacitors configured in a stack to form a substantially polygonal prism. Each film capacitor has orthotropic characteristics such that a thermal conductivity across the thickness of each film capacitor differs from a thermal conductivity across another dimension of the film capacitor, and such that a stiffness across the thickness of each film capacitor is less than a stiffness across another dimension of the film capacitor.

The inverter further comprises a heat conductor comprising a first substantially planar member configured to contact a first side of the polygonal prism formed by a single one of the film capacitors, and a second substantially planar member configured to contact a second side of the polygonal prism opposite the first side of the polygonal prism, the second side of the prism formed by another single one of the film capacitors. The first and second substantially planar members each comprise a thermally conductive material for dissipating heat generated by the plurality of film capacitors. The first and second substantially planar members have sufficient rigidity to confine expansion of the plurality of film capacitors across the thicknesses thereof.

A detailed description of these embodiments of an inverter for use in an electric vehicle (EV) or a hybrid-electric vehicle (HEV), including embodiments of a heat conductor for use with such an inverter, are set forth below together with accompanying drawings.

DETAILED DESCRIPTION

Figure 1:
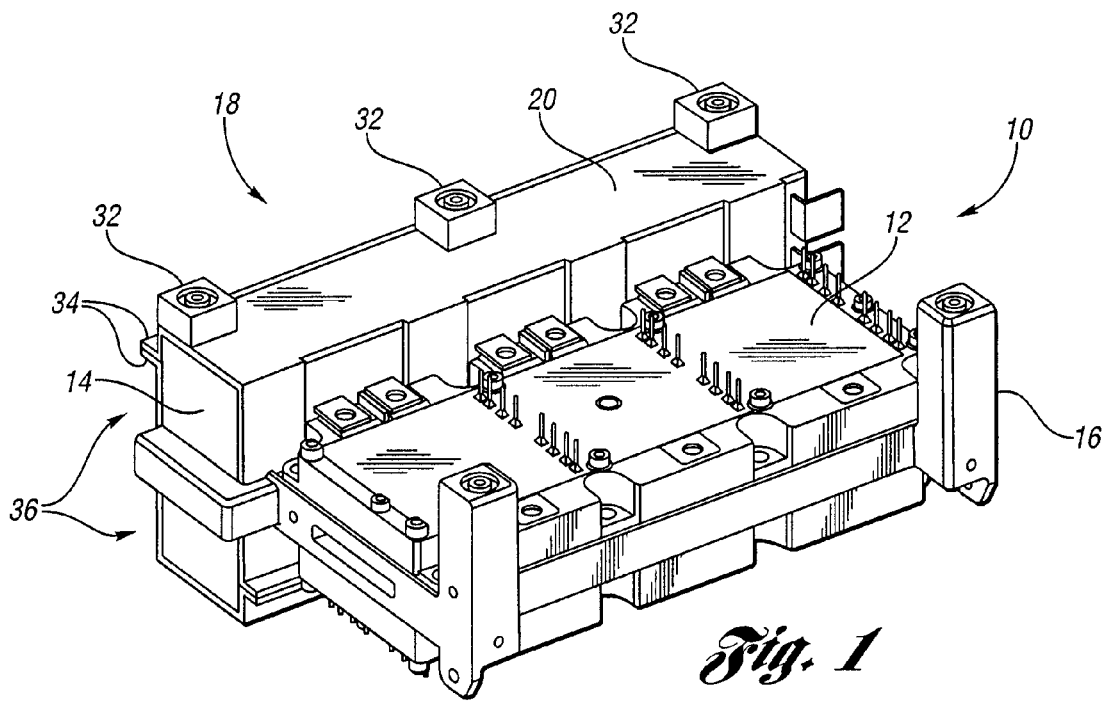
FIG. 1 is a perspective view of an inverter for use in an electric vehicle (EV) or a hybrid-electric vehicle (HEV), including an embodiment of a heat conductor for use with such an inverter as disclosed herein.

With reference to FIGS. 1-5, a more detailed description of embodiments of in inverter for use in an electric vehicle (EV) or a hybrid-electric vehicle (HEV), including embodiments of a heat conductor for use with such an inverter, will be described. For ease of illustration and to facilitate understanding, like reference numerals have been used herein for like components and features throughout the drawings.

As noted above, electric and hybrid-electric vehicles include an inverter for use in converting the direct current (DC) voltage stored and provided by the vehicle batteries to an AC voltage for use in powering the electric motor or motors of the vehicle. Such an inverter may comprise IGBT switching modules and a DC link capacitor, which itself may comprise a plurality of film capacitors.

In converting an input DC voltage to a AC voltage output, the film capacitors of the DC link capacitor generate heat as a result of the switching operations of the IGBT power modules. The heat generated as a result of such operations should be dissipated, such as through a coldplate, so that the inverter may continue to operate efficiently.

An exemplary power converter for use in electric or hybrid-electric vehicles is shown in U.S. Pat. No. 7,974,101 entitled "Power Converter." Exemplary heat dissipating devices, as well as various features thereof, are shown in U.S. Pat. No. 6,466,441 entitled "Cooling Device Of Electronic Part Having High And Low Heat Generating Elements," in U.S. Patent Application Publication No. 2010/0081191 entitled "Anisotropic Heat Spreader For Use With A Thermoelectric Device," and in U.S. Patent Application Publication No. 2010/0078807 entitled "Power Semiconductor Module Assembly With Heat Dissipating Element."

There exists, however, a need for additional heat dissipation beyond that which may be provided by standard coldplates currently in use with an EV or HEV inverter. Such an inverter would include a heat conductor configured to contact the DC link capacitor in order to provide for additional dissipation of the heat generated by inverter operation.

Figure 2:
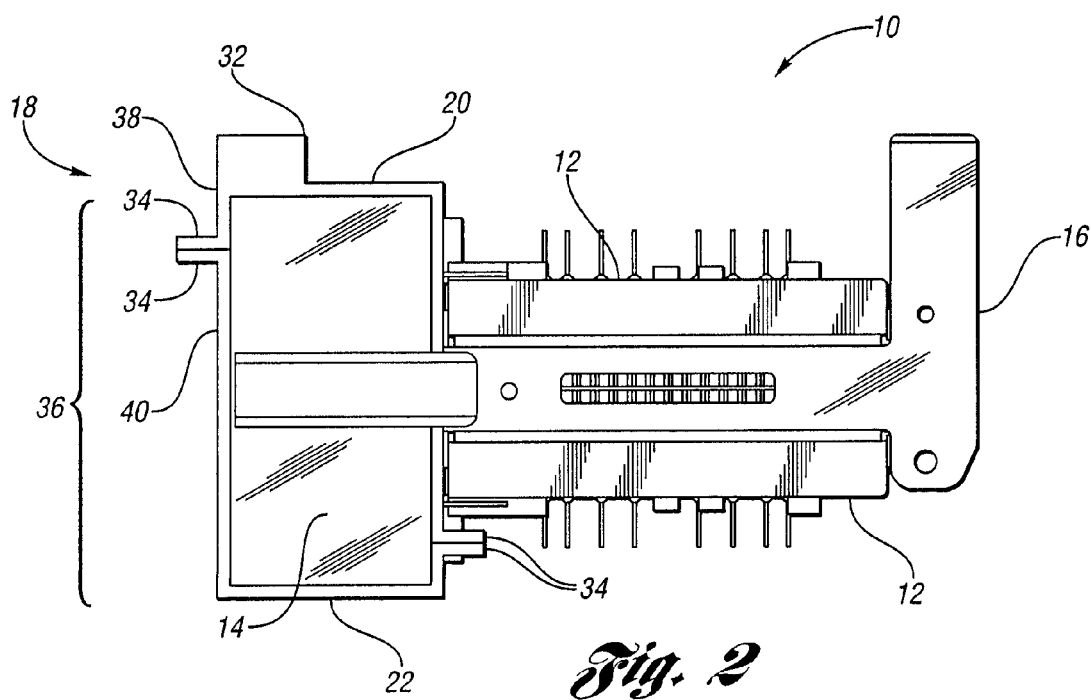
FIG. 2 is a side view of an inverter for use in an electric vehicle (EV) or a hybrid-electric vehicle (HEV), including an embodiment of a heat conductor for use with such an inverter as disclosed herein.

Referring now to FIGS. 1 and 2, perspective and side views of an inverter for use in an electric vehicle (EV) or a hybrid-electric vehicle (HEV), including an embodiment of a heat conductor for use with such an inverter, are shown. The inverter, denoted generally by reference numeral (10), may comprise integrated bipolar gate transistor (IBGT) power modules (12), a DC link capacitor (14), a coldplate (16), and a heat conductor (18).

As is well known in the art, IBGT power modules (12) and DC link capacitor (14) are provided in electrical communication and are for use in converting an DC voltage input from vehicle batteries (not shown) to an AC output voltage for powering an electric motor (not shown) of the vehicle. As is also well known, coldplate (16) is provided for use in dissipating heat produced by the operation of inverter (10).

Figure 3:
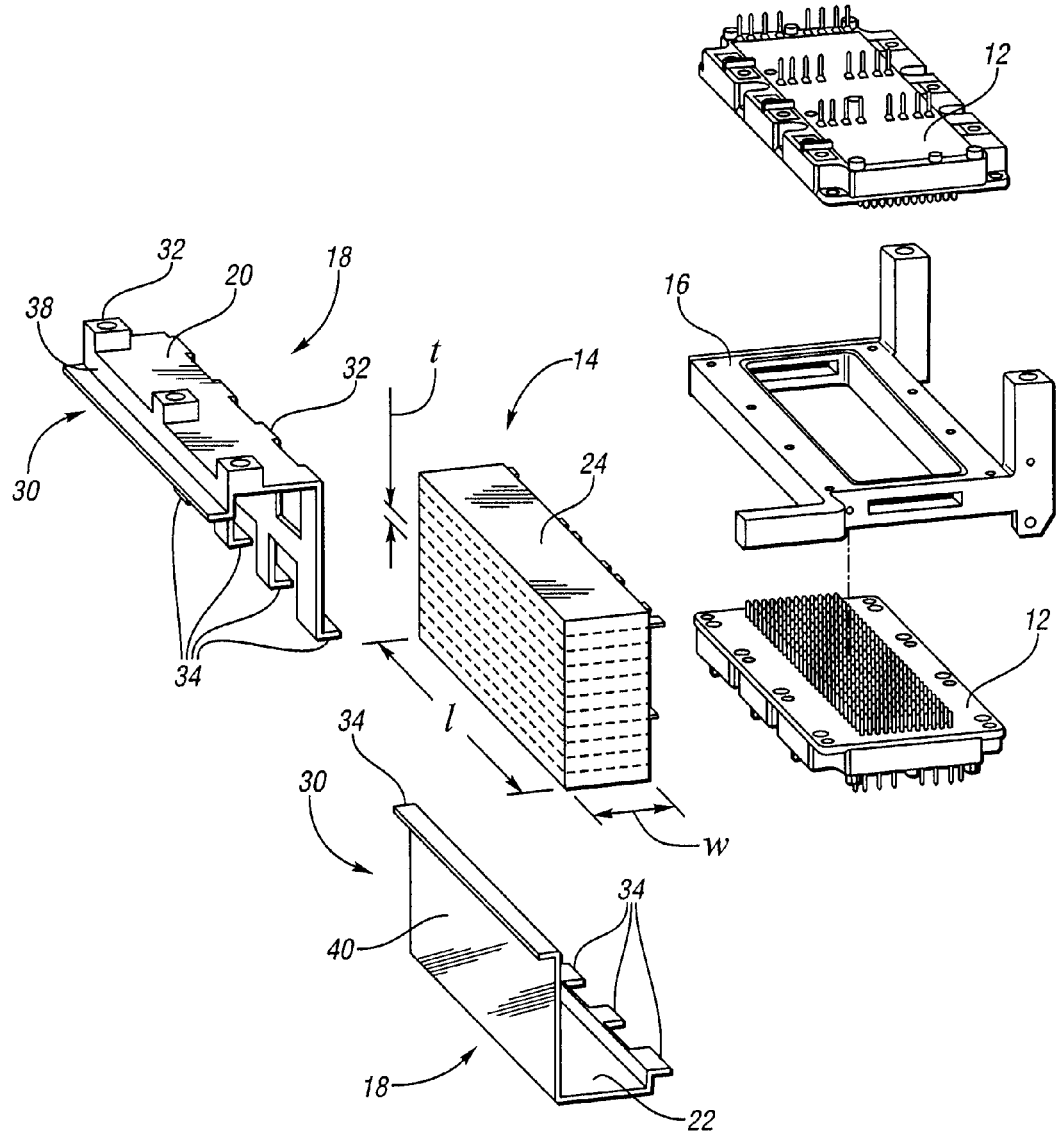
FIG. 3 is an exploded view of an inverter for use in an electric vehicle (EV) or a hybrid-electric vehicle (HEV), including an embodiment of a heat conductor for use with such an inverter as disclosed herein.

FIG. 3 depicts an exploded view of the inverter (10) for use in an electric vehicle (EV) or a hybrid-electric vehicle (HEV). As seen therein, inverter (10) again may comprise IBGT power modules (12), a DC link capacitor (14), and a coldplate (16). Inverter (10) may further comprise an embodiment of a heat conductor (18) for use in providing further dissipation of heat generated by the operation of inverter (10). In that regard, heat conductor (18) may comprise a thermally conductive material such as aluminum, another metal, an alloy, a ceramic, a composite, or any other suitably thermally conductive material, which may also have isotropic or anisotropic thermal characteristics.

Figure 4:
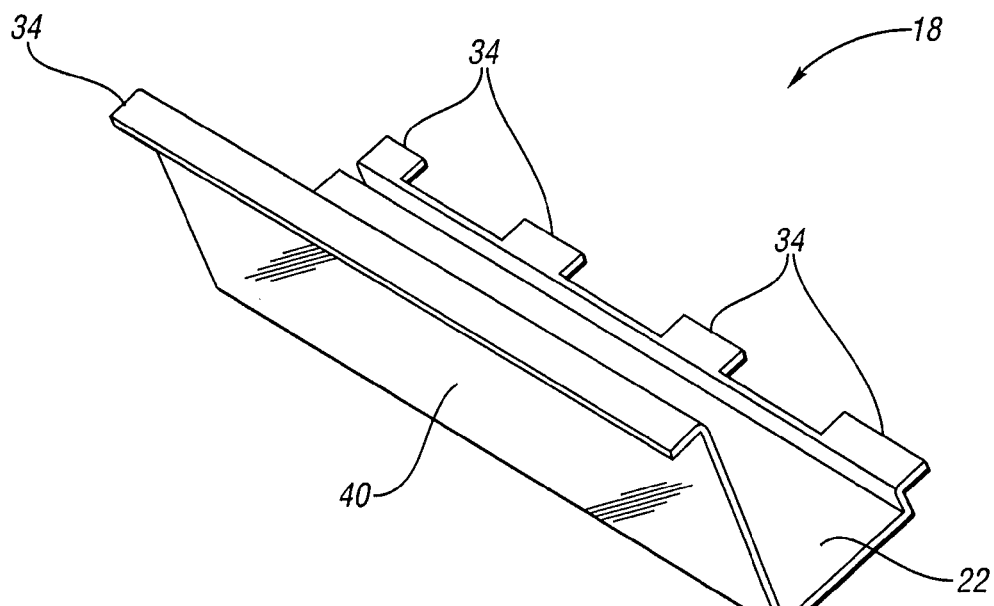
FIG. 4 is a perspective view of an embodiment of a portion of a heat conductor for use with an inverter as disclosed herein.
Figure 5:
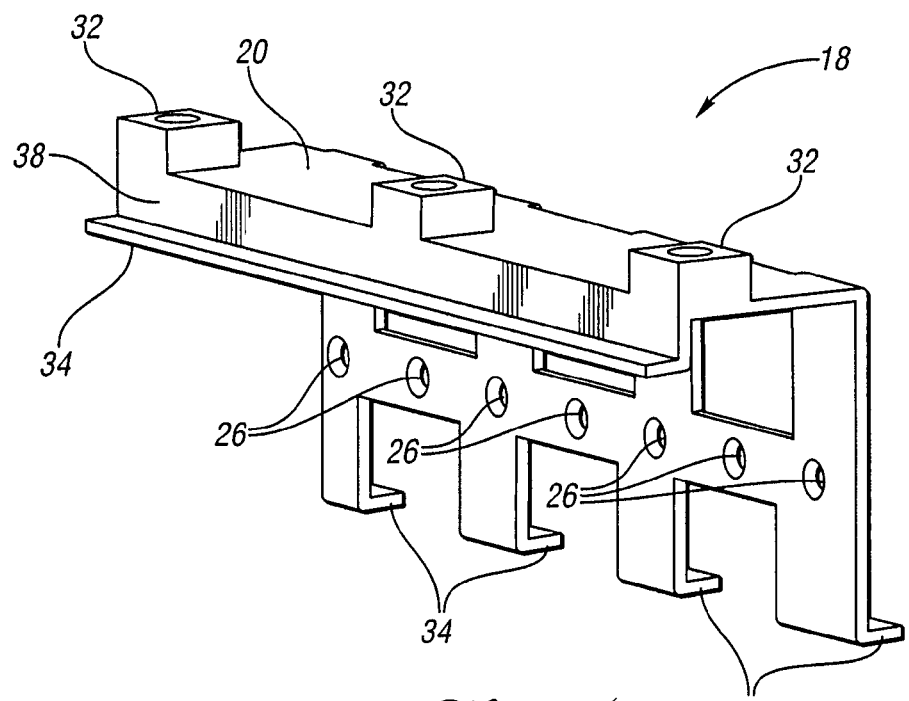
FIG. 5 is a perspective view of an embodiment of a portion of a heat conductor for use with an inverter as disclosed herein.

As seen in FIG. 3, heat conductor (18) may comprise first and second members (20, 22). With reference to FIGS. 4 and 5, perspective views of an embodiment of first and second members (20, 22) of a heat conductor (18) for use in an inverter (10) are shown.

With reference again to FIGS. 1-3, the DC link capacitor (14) may comprise a plurality of film capacitors (24) (shown in dashed lines) configured in a stack to form a substantially rectangular prism. In that regard, while DC link capacitor (14) is depicted herein as a rectangular prism, other polygonal prism shapes may be employed.

Each film capacitor (24) may have orthotropic characteristics such that a thermal conductivity across a thickness (t) of each film capacitor (24) differs from a thermal conductivity across another dimension of the film capacitor (24), such as a length (l) or a width (w). The orthotropic characteristics of the film capacitors (24) may also be such that a stiffness across the thickness (t) of each film capacitor (24) is less than a stiffness across another dimension of the film capacitor (24), such as length (l) or width (w).

Referring now to FIGS. 3-5, the heat conductor (18) may comprise a first substantially planar or plate-like member (20) configured to contact a first side of the polygonal prism formed by a single one of the film capacitors (24) of the DC link capacitor (14). In that regard, the description of member (20) as substantially planar or plate-like refers to the general shape of member (20), rather than to the surfaces thereof. As described in greater detail below, member (20) may include features such that a surface or surfaces thereof are not substantially planar. As previously noted, the first substantially planar or plate-like member (20) may comprise a thermally conductive material for dissipating heat generated by the plurality of film capacitors (24).

Heat conductor (18) may further comprise a second substantially planar or plate-like member (22) configured to contact a second side of the polygonal prism opposite the first side of the rectangular prism of the DC link capacitor (14), where the second side of the rectangular prism is formed by another single one of the film capacitors (24). Here again, the description of member (22) as substantially planar or plate-like refers to the general shape of member (22), rather than to the surfaces thereof. As described in greater detail below, member (22) may include features such that a surface or surfaces thereof are not substantially planar. As also previously noted, the second substantially planar or plate-like member (22) may comprise a thermally conductive material for dissipating heat generated by the plurality of film capacitors (24).

As seen in FIGS. 3-5, the heat conductor (18) may also comprise an interconnect (30), which may be provided for fixedly attaching the first and second substantially planar or plate-like members (20, 22). As well, the first and second substantially planar or plate-like members (20, 22) may be provided with sufficient rigidity, which may result from the material properties, thicknesses, shape and/or other characteristics of the first and second substantially planar or plate-like members (20, 22), to confine expansion of the plurality of film capacitors (24) across the thicknesses (t) thereof.

As depicted in FIGS. 1-3, the first and second substantially planar or plate-like members (20, 22) may be substantially coextensive with the first and second sides of the prism formed by the film capacitors (24) of the DC link capacitor (14) to thereby substantially contain expansion of the plurality of film capacitors (24) across the thicknesses (t) thereof. As previously described, first and second substantially planar or plate-like members (20, 22) may be provided with sufficient rigidity for that purpose, which again may result from the material properties, thicknesses, shape or other characteristics of the first and second substantially planar or plate-like members (20, 22). It should be noted, however, that the first and second substantially planar or plate-like members (20, 22) may alternatively be less than substantially coextensive with the first and second sides of the prism formed by the film capacitors (24) of the DC link capacitor (14).

Still referring to FIGS. 3-5, the first and/or second substantially planar or plate-like member (20, 22) may comprises one or more features to increase a surface area of the first and/or second substantially planar or plate-like members (20, 22) to facilitate heat dissipation. As seen in FIGS. 3-5, such features may take the form of multiple stacks (32), fins (34) or both, although any other such features for increasing a surface area known in the art, such as surface grooves or other features (not shown), may also or alternatively be employed. As seen in FIG. 5, the heat conductor (18) may also comprise one or more features for use in attaching the first substantially planar or plate-like member (20) to coldplate (16). In that regard, while such features are depicted in FIG. 5 as through-holes (26) for use with cooperating screws or bolts (not shown), any other attachment feature or features known in the art may be employed.

As seen in FIGS. 2-5, the previously discussed interconnect (30) may comprises a third substantially planar or plate-like member (36). In that regard, the description of member (36) as substantially planar or plate-like refers to the general shape of member (36), rather than to the surfaces thereof. As described in greater detail below, member (36) may include features such that a surface or surfaces thereof are not substantially planar. The third substantially planar or plate-like member (36) may also comprise a thermally conductive material, such as aluminum, another metal, an alloy, a ceramic, a composite or other suitably conductive material, which again may have isotropic or anisotropic thermal characteristics. The third substantially planar or plate-like member (36) may also be substantially coextensive with and configured to contact a third side of the substantially polygonal prism of the DC link capacitor (14), and oriented between the previously described first and second sides of that prism associated with the first and second substantially planar or plate-like members (20, 22) of the heat conductor (18). The third substantially planar or plate-like member (36) may also be provided with sufficient rigidity, which may result from the material properties, thicknesses, shape or other characteristics of the third substantially planar or plate-like member (36), to assist in confining expansion of the plurality of film capacitors (24) of the DC link capacitor (14) across the thicknesses (t) of the film capacitors (24).

In that same regard, the third substantially planar or plate-like member (36) may comprise a first piece (38) extending from the first substantially planar or plate-like member (20) and a second piece (40) extending from the second substantially planar or plate-like member (22). The first and second pieces (38, 40), which may be integral with the first and second substantially planar or plate-like members (20, 22), respectively, may be provided with attachment features configured to cooperate for attachment of the first and second pieces (38, 40). As seen in FIGS. 3-5, the attachment features of the first and second pieces (38) may be further configured to operate as heat dissipating features (such as fins (30)) by increasing a surface area of the third substantially planar or plate-like member (36). The third substantially planar or plate-like member (36) may also comprise one or more other features to increase a surface area of the third substantially planar or plate-like member (36) to facilitate heat dissipation, which may take the form of fins or any other such features for increasing a surface area known in the art, such as stacks, surface grooves or other features (not shown).

As is readily apparent from the foregoing, a heat conductor for use with an inverter in an electric vehicle (EV) or a hybrid-electric vehicle (HEV) have been described. The embodiments of the heat conductor described provide for additional heat dissipation beyond that which may be supplied by a standard coldplate used with an EV or HEV inverter. Such embodiments include a heat conductor configured to contact a DC link capacitor used in the inverter in order to provide for additional dissipation of the heat generated by inverter operation, thereby providing for efficient operation of the inverter.

While various embodiments of a heat conductor for use with an inverter in an electric vehicle (EV) or a hybrid-electric vehicle (HEV) have been illustrated and described herein, they are exemplary only and it is not intended that these embodiments illustrate and describe all those possible. Instead, the words used herein are words of description rather than limitation, and it is understood that various changes may be made to these embodiments without departing from the spirit and scope of the following claims.

What is claimed is:

1. A heat conductor for use with an inverter in an electric vehicle (EV) or a hybrid-electric vehicle (HEV), the inverter including a direct current (DC) link capacitor comprising a plurality of film capacitors configured in a stack to form a substantially polygonal prism, wherein each film capacitor has orthotropic characteristics such that a thermal conductivity across a thickness of each film capacitor differs from a thermal conductivity across another dimension of the film capacitor, and such that a stiffness across the thickness of each film capacitor is less than a stiffness across another dimension of the film capacitor, the heat conductor comprising:

a first substantially planar member configured to contact a first side of the polygonal prism formed by a single one of the film capacitors, the first substantially planar member comprising a thermally conductive material for dissipating heat generated by the plurality of film capacitors;

a second substantially planar member configured to contact a second side of the polygonal prism opposite the first side of the polygonal prism, the second side of the polygonal prism formed by another single one of the film capacitors, the second substantially planar member comprising a thermally conductive material for dissipating heat generated by the plurality of film capacitors; and an interconnect for fixedly attaching the first and second substantially planar members, wherein the interconnect comprises a third substantially planar member comprising a thermally conductive material, the third planar member substantially coextensive with a third side of the substantially polygonal prism oriented between the first and second sides of the prism, wherein the third substantially planar member comprises a first piece extending from the first substantially planar member and a second piece extending from the second substantially planar member, the first and second pieces each having an attachment feature, the attachment features of the first and second pieces configured to cooperate for attachment of the first and second pieces, and wherein the attachment features of the first and second pieces are further configured to operate as heat dissipating features by increasing a surface area of the third substantially planar member;

wherein the first and second substantially planar members have sufficient rigidity to confine expansion of the plurality of film capacitors across the thicknesses thereof.

2. The heat conductor of claim 1 wherein the first and second substantially planar members comprise a metal.

3. The heat conductor of claim 1 wherein the first and second substantially planar members are substantially coextensive with the first and second sides of the prism.

4. The heat conductor of claim 3 wherein the first and second substantially planar members are substantially coextensive with the first and second sides of the prism to substantially contain expansion of the film capacitors.

5. The heat conductor of claim 1 wherein the first substantially planar member comprises at least one feature to increase a surface area of the first substantially planar member to facilitate heat dissipation.

6. The heat conductor of claim 1 further comprising a feature configured to attach the first substantially planar member to a cold plate.

7. A heat conductor for use with an inverter in an electric vehicle (EV) or a hybrid-electric vehicle (HEV), the inverter including a direct current (DC) link capacitor comprising a plurality of film capacitors configured in a stack to form a substantially polygonal prism, wherein each film capacitor has orthotropic characteristics such that a thermal conductivity across the thickness of each film capacitor differs from a thermal conductivity across another dimension of the film capacitor, and such that a stiffness across the thickness of each film capacitor is less than a stiffness across another dimension of the film capacitor, the heat conductor comprising:

a first plate configured to contact a first side of the polygonal prism formed by a single one of the film capacitors, the first plate substantially coextensive with the first side of the prism and comprising a thermally conductive material for dissipating heat generated by the plurality of film capacitors;

a second plate configured to contact a second side of the polygonal prism opposite the first side of the polygonal prism, the second side of the prism formed by another single one of the film capacitors, the second plate substantially coextensive with the second side of the prism and comprising a thermally conductive material for dissipating heat generated by the plurality of film capacitors; and a third plate fixedly connecting the first and second plates, wherein the third plate comprises a thermally conductive material and is substantially coextensive with a third side of the polygonal prism between the first and second sides of the prism, wherein the third plate comprises a first piece extending from the first plate and a second piece extending from the second plate, the first and second pieces each having an attachment feature, the attachment features of the first and second pieces configured to cooperate for attachment of the first and second pieces, wherein the attachment feature of the first and second pieces are further configured to operate as heat dissipating features by increasing the surface area of the third plate;

wherein the first and second plates have sufficient rigidity to confine expansion of the plurality of film capacitors across the thicknesses thereof.

8. The heat conductor of claim 7 wherein the first and second plates comprise a metal.

9. The heat conductor of claim 7 wherein the first plate comprises at least one feature to increase a surface area of the first substantially planar member to facilitate heat dissipation.

10. The heat conductor of claim 7 wherein the first and second plates are substantially coextensive with the first and second sides of the prism to substantially contain expansion of the film capacitors.

11. The heat conductor of claim 7 wherein the third plate comprises a metal.

12. An inverter in an electric vehicle (EV) or a hybrid-electric vehicle (HEV), the inverter comprising:

a direct current (DC) link capacitor comprising a plurality of film capacitors configured in a stack to form a substantially polygonal prism, wherein each film capacitor has orthotropic characteristics such that a thermal conductivity across the thickness of each film capacitor differs from a thermal conductivity across another dimension of the film capacitor, and such that a stiffness across the thickness of each film capacitor is less than a stiffness across another dimension of the film capacitor;

a heat conductor comprising a first substantially planar member configured to contact a first side of the polygonal prism formed by a single one of the film capacitors, and a second substantially planar member configured to contact a second side of the polygonal prism opposite the first side of the polygonal prism, the second side of the prism formed by another single one of the film capacitors, the first and second substantially planar members comprising a thermally conductive material for dissipating heat generated by the plurality of film capacitors; and an interconnect for fixedly attaching the first and second substantially planar members, wherein the interconnect comprises a third substantially planar member comprising a thermally conductive material, the third planar member substantially coextensive with a third side of the substantially polygonal prism oriented between the first and second sides of the prism, wherein the third substantially planar member comprises a first piece extending from the first substantially planar member and a second piece extending from the second substantially planar member, the first and second pieces each having an attachment feature, the attachment features of the first and second pieces configured to cooperate for attachment of the first and second pieces, and wherein the attachment features of the first and second pieces are further configured to operate as heat dissipating features by increasing a surface area of the third substantially planar member;

wherein the first and second substantially planar members have sufficient rigidity to confine expansion of the plurality of film capacitors across the thicknesses thereof.

13. The inverter of claim 12 further comprising a cold plate for attachment to the heat conductor.

\* \* \* \* \*